United States Patent
Sasaki et al.

(10) Patent No.: US 11,222,879 B2
(45) Date of Patent: Jan. 11, 2022

(54) SEMICONDUCTOR MODULE STRUCTURE

(71) Applicant: TOYOTA JIDOSHA KABUSHIKI KAISHA, Toyota (JP)

(72) Inventors: Tomo Sasaki, Susono (JP); Hideyuki Murayama, Seto (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 16/924,771

(22) Filed: Jul. 9, 2020

(65) Prior Publication Data
US 2021/0028154 A1 Jan. 28, 2021

(30) Foreign Application Priority Data

Jul. 24, 2019 (JP) .............................. JP2019-135894

(51) Int. Cl.
| | | |
|---|---|---|
| H01L 25/16 | (2006.01) | |
| H01L 25/07 | (2006.01) | |
| H01L 23/367 | (2006.01) | |
| H01L 23/50 | (2006.01) | |
| H01L 25/11 | (2006.01) | |
| H01L 23/433 | (2006.01) | |
| H01L 23/473 | (2006.01) | |
| H05K 7/20 | (2006.01) | |
| H02M 7/537 | (2006.01) | |
| H02M 7/48 | (2007.01) | |
| H01L 49/02 | (2006.01) | |

(52) U.S. Cl.
CPC .......... *H01L 25/16* (2013.01); *H01L 23/3672* (2013.01); *H01L 23/50* (2013.01); *H01L 25/071* (2013.01); *H01L 28/40* (2013.01)

(58) Field of Classification Search
CPC .................................................. H01L 23/3672
See application file for complete search history.

(56) References Cited

U.S. PATENT DOCUMENTS

| | | | | |
|---|---|---|---|---|
| 2001/0033477 A1* | 10/2001 | Inoue | .................... | H01L 25/072 361/718 |
| 2012/0250253 A1* | 10/2012 | Chou | .................. | H01L 23/3735 361/689 |
| 2014/0246768 A1* | 9/2014 | Soyano | ................. | H01L 25/162 257/691 |
| 2019/0131883 A1* | 5/2019 | Kitamura | ................ | H01L 25/07 |

FOREIGN PATENT DOCUMENTS

JP        2017-188998 A      10/2017

* cited by examiner

*Primary Examiner* — Omar F Mojaddedi
(74) *Attorney, Agent, or Firm* — Oliff PLC

(57) ABSTRACT

A semiconductor module structure includes: a semiconductor element portion including a plurality of capacitor elements; two bus bars sandwiching the semiconductor element portion and being electrically connected to the semiconductor element portion; and cooling fins, which are conductive, formed on respective surfaces of the bus bars at positions sandwiching the semiconductor element portion. Further, insulating refrigerant is provided in the cooling fins.

2 Claims, 2 Drawing Sheets

SEMICONDUCTOR MODULE STRUCTURE

CROSS-REFERENCE TO RELATED APPLICATION(S)

The present application claims priority to and incorporates by reference the entire contents of Japanese Patent Application No. 2019-135894 filed in Japan on Jul. 24, 2019.

BACKGROUND

The present disclosure relates to a semiconductor module structure.

Japanese Laid-open Patent Publication No. 2017-188998 describes a structure including: a switching element; a capacitor; a bus bar that electrically connects the switching element and the capacitor; and a cooler for cooling by arranging the switching element and the capacitor on the same plane. Further, the bus bar is in contact with the cooler via an electrically insulating heat conductive material to cool the bus bar.

SUMMARY

There is a need for providing a semiconductor module structure that can be downsized while achieving effective cooling of a bus bar.

According to an embodiment, a semiconductor module structure includes: a semiconductor element portion including a plurality of capacitor elements; two bus bars sandwiching the semiconductor element portion and being electrically connected to the semiconductor element portion; and cooling fins, which are conductive, formed on respective surfaces of the bus bars at positions sandwiching the semiconductor element portion. Further, insulating refrigerant is provided in the cooling fins.

DETAILED DESCRIPTION OF THE PREFERRED EMBODIMENTS

In the related art, for example, in the structure described in Japanese Laid-open Patent Publication No. 2017-188998, it is necessary to bring the bus bar into contact with the electrically insulating heat conductive material in order to cool the bus bar and, therefore, the length of the bus bar is made longer, making it difficult to reduce the size of the structure. Furthermore, in the structure described in Japanese Laid-open Patent Publication No. 2017-188998, because the bus bar is in contact with the cooler via the electrically insulating heat conductive material, the cooling performance of the bus bar may be insufficient. As a result, the bus bar generates heat, so that elements, such as the switching elements and capacitors connected to the bus bar, may become hot.

A semiconductor module structure according to one embodiment of the present disclosure will be described below with reference to the accompanied drawings.

Circuit Configuration

First, a configuration of an electronic circuit formed by a semiconductor module structure according to the one embodiment of the present disclosure will be described with reference to FIG. 1.

Figure 1:
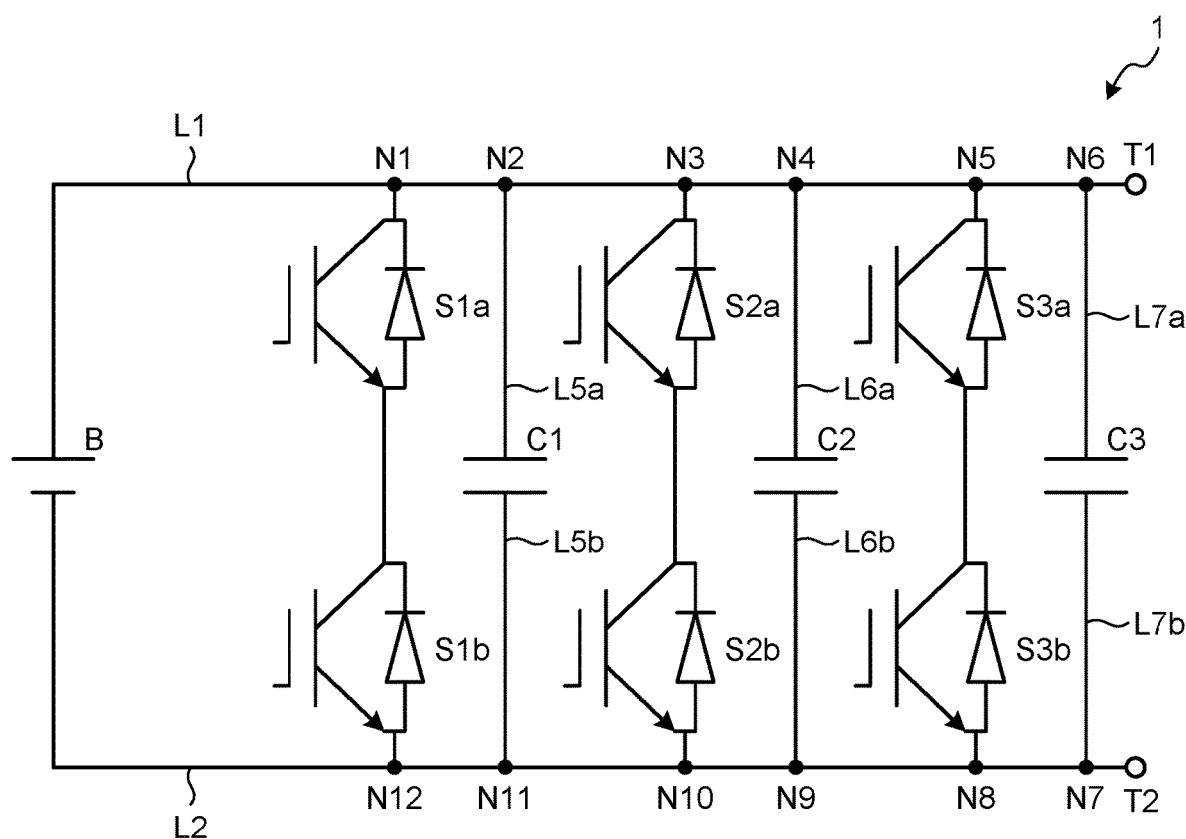
FIG. 1 is a diagram illustrating a configuration of an electronic circuit formed by a semiconductor module structure according to one embodiment of the present disclosure.

FIG. 1 is a diagram illustrating a configuration of an electronic circuit formed by a semiconductor module structure according to one embodiment of the present disclosure. As illustrated in FIG. 1, an electronic circuit 1 formed by the semiconductor module structure according to the one embodiment of the present disclosure performs a switching operation of a plurality of switching elements, thereby converting DC power output from a power source B such as a battery into three-phase (U-phase, V-phase, and W-phase) AC power, and outputting the AC power from terminals T1, T2. This electronic circuit is mounted in a vehicle. Note that the switching operation means an operation of switching on/off a switching element to be controlled.

In the present embodiment, the electronic circuit 1 includes switching elements S1a, S1b, switching elements S2a, S2b, switching elements S3a, S3b, and capacitor elements C1, C2, C3.

Each switching element is composed of a semiconductor switching element. As a semiconductor switching element, an insulated gate bipolar transistor (IGBT) is used. A diode (rectifier element) is connected between a collector terminal and an emitter terminal of the IGBT, with the side connected to the emitter terminal as an anode. When a device other than an IGBT is used as a semiconductor switching element, a diode is connected in parallel to the semiconductor switching element so that a current flows in a direction opposite to a current flowing when the switching element is turned on. The diode may be a parasitic diode associated with the semiconductor switching element. In this description, a combination of a semiconductor switching element and a diode is called a switching element.

The pair of switching elements S1a and S1b are connected in series between a positive electrode bus bar (a P bus bar) L1 electrically connected to the positive electrode of a power supply B and a negative electrode bus bar (an N bus bar) L2 electrically connected to the negative electrode of the power supply B, at a node N1 and a node N12 respectively. In addition, the capacitor element C1 is connected to the positive electrode bus bar L1 and the negative electrode bus bar L2 via a capacitor bus bar L5a and a capacitor bus bar L5b, at a node N2 and a node N11, respectively, so as to be connected in parallel to the switching element S1a and the switching element S1b The capacitor element C1 functions as a smoothing capacitor that smooths U-phase AC power output by a switching operation of the switching element S1a, S1b.

The pair of switching elements S2a and S2b are connected in series between the positive electrode bus bar L1 and the negative electrode bus bar L2, at a node N3 and a node N10 respectively. In addition, the capacitor element C2 is connected to the positive electrode bus bar L1 and the negative electrode bus bar L2 via a capacitor bus bar L6a and a capacitor bus bar L6b, at a node N4 and a node N9, respectively, so as to be connected in parallel to the switching element S2a and the switching element S2b. The capacitor element C2 functions as a smoothing capacitor that smooths V-phase AC power output by a switching operation of the switching element S2a, S2b.

The pair of switching elements S3a and S3b are connected in series between the positive electrode bus bar L1 and the negative electrode bus bar L2, at a node N5 and a node N8 respectively. In addition, the capacitor element C3 is connected to the positive electrode bus bar L1 and the negative electrode bus bar L2 via a capacitor bus bar L7a and a capacitor bus bar L7b, at a node N6 and a node N7, respectively, so as to be connected in parallel to the switching element S3a and the switching element S3b. The capacitor element C3 functions as a smoothing capacitor that smooths W-phase AC power output by a switching operation of the switching element S3a, S3b.

Structure

Next, the semiconductor module structure according to the one embodiment of the present disclosure will be described with reference to FIGS. 2A and 2B.

Figure 2A:
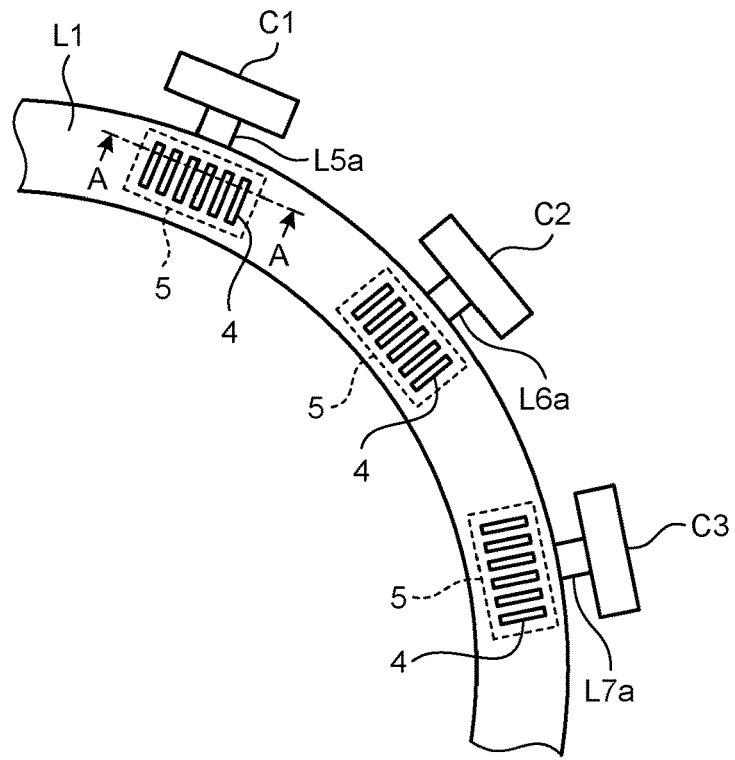
FIGS. 2A and 2B are a plan view and a cross-sectional view of the plan view, respectively, illustrating the configuration of the semiconductor module structure according to the one embodiment of the present disclosure.
Figure 2B:
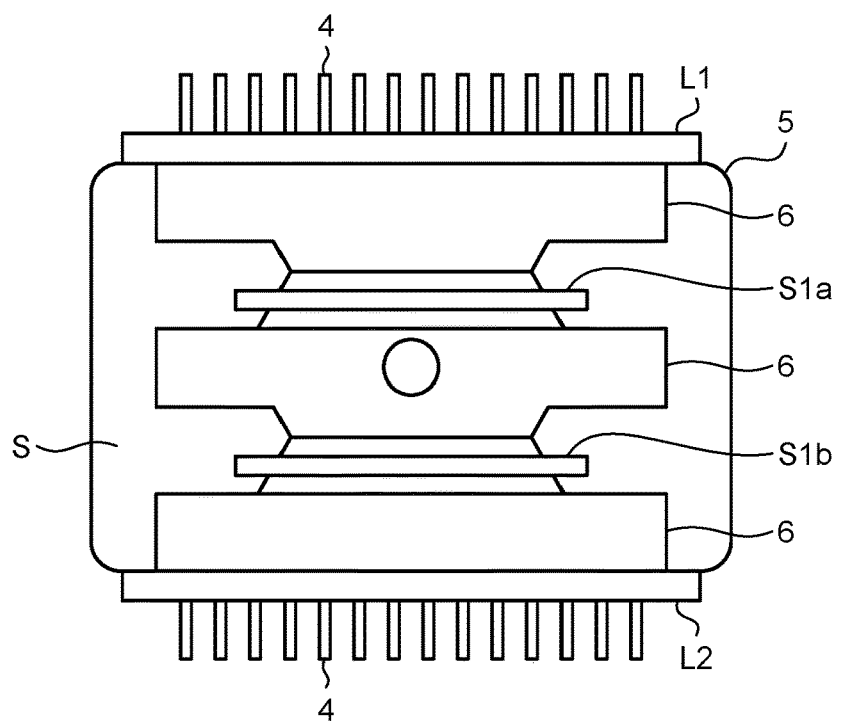

FIG. 2A is a plan view illustrating a configuration of the semiconductor module structure according to the one embodiment of the present disclosure, and FIG. 2B is a cross-sectional view taken along the line A-A of FIG. 2A. As illustrated in FIGS. 2A and 2B, the semiconductor module structure according to the one embodiment of the present disclosure includes: the annular positive electrode bus bars L1 and L2, each having a conductive cooling fin 4; a plurality of semiconductor element portions 5 sandwiched by the positive electrode bus bar L1 and the negative electrode bus bar L2; and the capacitor elements C1 to C3 connected to the positive electrode bus bar L1 and the negative electrode bus bar L2 via the capacitor bus bars L5a, L5b, L6a, L6b, L7a, L7b. In FIG. 2A, the capacitor bus bars L5b, L6b, L7b are not illustrated.

Each of the semiconductor element portions 5 has a package structure housing therein the respective pair of switching elements (in this example, the pair of switching elements S1a and S1b) sandwiched by heat sinks 6 made of copper. The semiconductor element portions are arranged at predetermined intervals along the respective circumferential directions of the positive electrode bus bar L1 and the negative electrode bus bar L2. The pairs of switching elements in the respective semiconductor element portions 5 are electrically connected to the positive electrode bus bar L1 and the negative electrode bus bar L2 and form the electronic circuit 1 illustrated in FIG. 1 The internal space S of each package structure forming the respective semiconductor element portion 5 is filled with a resin mold.

The conductive cooling fins 4 are respectively formed on the respective surfaces of the positive electrode bus bar L1 and the negative electrode bus bar L2 corresponding to the position at which the respective semiconductor element portion 5 is sandwiched, and insulating refrigerant is supplied in the cooling fins 4. By providing the conductive cooling fins 4 at the position where the semiconductor element portion 5 is sandwiched, the positive electrode bus bar L1 and the negative electrode bus bar L2 and the semiconductor element portion 5 both can be cooled. In addition, by making the cooling fins 4 conductive, the cooling fins 4 can be made to function as a bus bar. However, where the cooling fins 4 are made conductive, it is desirable to ensure insulation between the positive electrode bus bar L1 and the negative electrode bus bar L2 by interposing insulating refrigerant between the positive electrode bus bar L1 and the negative electrode bus bar L2.

As is clear from the above description, a semiconductor module structure according to a present disclosure comprises: a semiconductor element portion 5; a positive electrode bus bar L1 and a negative electrode bus bar L2, sandwiching the semiconductor element portion 5 and electrically connected to the semiconductor element portion 5; and capacitor elements C1 to C3 electrically connected to the positive electrode bus bar L1 and the negative electrode bus bar L2 via capacitor bus bars L5a, L5b, L6a, L6b, L7a, L7b. Conductive cooling fins 4 are formed on respective surfaces of the positive electrode bus bar L1 and negative electrode bus bar L2 corresponding to a position sandwiching the semiconductor element portion 5, and insulating refrigerant is supplied in the cooling fins 4. According to such a configuration, because the cooling fins 4 have both a cooling function and a bus bar function, the semiconductor module structure can be downsized while achieving effective cooling of the bus bars.

In the semiconductor module structure according to the present disclosure, because the cooling fins have both a cooling function and a bus bar function, the semiconductor module structure can be downsized while achieving effective cooling of the bus bar.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor module structure comprising:
    a semiconductor element portion including a plurality of capacitor elements;
    two bus bars separate from each other, the two bus bars sandwiching the semiconductor element portion and being electrically connected to the semiconductor element portion; and
    a plurality of cooling fins, each of which is conductive, wherein at least one of the plurality of cooling fins is formed on a surface of one of the two bus bars and extends from the surface and in a direction opposite from an other of the two bus bars, and at least one other of the plurality of cooling fins is formed on a surface of the other of the two bus bars,
    wherein insulating refrigerant is provided in the cooling fins, and
        wherein the bus bars are formed of an annular member, and a plurality of pairs of the semiconductor element portion and the capacitor elements are arranged along a circumferential direction of the bus bars.

2. The semiconductor module structure according to claim 1, wherein the semiconductor element portion has a package structure housing semiconductor elements therein, and a space in the package structure is filled with a resin mold.

* * * * *